United States Patent
Kumar et al.

(10) Patent No.: US 10,521,045 B2
(45) Date of Patent: Dec. 31, 2019

(54) REFERENCE NOISE REJECTION IMPROVEMENT BASED ON SAMPLE AND HOLD CIRCUITRY

(71) Applicant: Microchip Technology Incorporated, Chandler, AZ (US)

(72) Inventors: Ajay Kumar, Phoenix, AZ (US); Mikael Tual, Campbon (FR); Régis Vix, Sainte Luce sur Loire (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 47 days.

(21) Appl. No.: 15/896,494

(22) Filed: Feb. 14, 2018

(65) Prior Publication Data
US 2019/0250756 A1    Aug. 15, 2019

(51) Int. Cl.
G06F 3/044 (2006.01)
G06F 3/041 (2006.01)
G11C 27/02 (2006.01)

(52) U.S. Cl.
CPC ............ G06F 3/0416 (2013.01); G06F 3/044 (2013.01); G11C 27/02 (2013.01)

(58) Field of Classification Search
CPC ...... G06F 3/0416; G06F 3/044; G06F 3/0418; G11C 27/02; H03K 2217/960705; H03K 2217/960765; H03K 17/955; H03K 17/9622
See application file for complete search history.

(56) References Cited

U.S. PATENT DOCUMENTS

| | | | | |
|---|---|---|---|---|
| 7,777,502 B2* | 8/2010 | Grosser | ................ | D06F 39/005 324/676 |
| 7,825,832 B2* | 11/2010 | Nishimura | .............. | G06F 3/044 341/5 |
| 9,223,425 B1* | 12/2015 | Kim | ...................... | G06F 3/0412 |
| 2010/0110040 A1* | 5/2010 | Kim | ...................... | G06F 3/0412 345/174 |
| 2011/0073383 A1* | 3/2011 | Simmons | ............. | H03K 17/962 178/18.06 |
| 2011/0193817 A1* | 8/2011 | Byun | .................... | G06F 3/0418 345/174 |

(Continued)

FOREIGN PATENT DOCUMENTS

| | | | | |
|---|---|---|---|---|
| EP | 1635147 A2 | 3/2006 | ............... | G01D 5/24 |
| WO | 2014/166881 A1 | 10/2014 | ............... | B60N 2/56 |

OTHER PUBLICATIONS

International Search Report and Written Opinion, Application No. PCT/US2019/017640, 18 pages, dated May 2, 2019.

*Primary Examiner* — Jose R Soto Lopez
(74) *Attorney, Agent, or Firm* — Slayden Grubert Beard PLLC

(57) ABSTRACT

A touch controller may include a measurement circuit, configured to receive a signal from an active channel in a proximity sensor, and to sample and hold the signal to measure the signal. The touch controller may include a driven shield buffer. The touch controller may include a voltage reference circuit configured to generate a divided voltage reference, provide the divided voltage reference to the measurement circuit, and drive the divided voltage reference through a switched circuit to the driven shield buffer to hold channels in the proximity sensor during measurement of the active channel.

14 Claims, 2 Drawing Sheets

(56) References Cited

U.S. PATENT DOCUMENTS

| | | | |
|---|---|---|---|
| 2012/0050214 A1* | 3/2012 | Kremin | G06F 3/0418 345/174 |
| 2012/0139563 A1* | 6/2012 | Teissier | G06F 3/044 324/679 |
| 2013/0257518 A1* | 10/2013 | Hou | H03K 17/962 327/517 |
| 2014/0152616 A1* | 6/2014 | Kida | G06F 3/0418 345/174 |
| 2014/0160371 A1* | 6/2014 | Tokita | G02F 1/1309 349/12 |
| 2014/0292700 A1* | 10/2014 | Mizuhashi | G06F 3/044 345/173 |
| 2014/0362042 A1* | 12/2014 | Noguchi | G06F 3/0412 345/174 |
| 2015/0042599 A1* | 2/2015 | Lukanc | G06F 3/0412 345/174 |
| 2015/0116261 A1* | 4/2015 | Ahn | G06F 3/0418 345/174 |
| 2015/0205433 A1* | 7/2015 | Mizuhashi | G06F 3/0416 345/174 |
| 2016/0266694 A1* | 9/2016 | Lee | G06F 3/0412 |
| 2016/0378252 A1* | 12/2016 | Jeong | G06F 3/044 345/174 |
| 2017/0160833 A1* | 6/2017 | Han | G06F 3/044 |
| 2017/0192551 A1* | 7/2017 | Kim | G06F 3/0418 |
| 2017/0193262 A1* | 7/2017 | Lo | G01R 27/2605 |
| 2017/0300167 A1* | 10/2017 | Lee | G06F 3/0416 |
| 2017/0331475 A1* | 11/2017 | Chen | G05F 3/08 |
| 2018/0004353 A1* | 1/2018 | Shin | G02F 1/13338 |
| 2018/0101260 A1* | 4/2018 | Morita | G02F 1/13338 |
| 2018/0253177 A1* | 9/2018 | Yang | G06F 3/0412 |
| 2018/0321793 A1* | 11/2018 | Kim | G06F 3/0418 |

* cited by examiner

REFERENCE NOISE REJECTION IMPROVEMENT BASED ON SAMPLE AND HOLD CIRCUITRY

FIELD OF THE INVENTION

The present disclosure relates to touch and proximity detection for human-machine interfaces and, more particularly, to reference noise rejection using sample and hold circuitry.

BACKGROUND

Noise may include random fluctuations in electrical signals. The noise may be errors or undesired random disturbances of a useful information signal. The noise is a summation of unwanted or disturbing energy from natural or man-made sources. Noise may be quantified by a signal-to-noise ratio (SNR). Noise may have various sources. Noise may include, for example, thermal noise, shot noise, flicker noise, burst noise, transit-time noise, coupled noise, intermodulation noise, crosstalk, interference, or industrial noise. Industrial noise may include noise from the components of equipment, which may affect surrounding components or components within the equipment. For example, noise may be generated when an electric motor starts and stops. In another example, water on a touch-panel may cause a variance in capacitance and thus introduce noise.

Noise may be reduced through a variety of techniques. Noise can be reduced through Faraday cages, avoiding capacitive coupling, or avoiding ground loops. However, in some cases it is not possible to have all ground connections connected to an identical ground bus.

Noise may be typically measured as an electrical power N in watts or dBm, a root mean square (RMS) voltage (identical to the noise standard deviation) in volts, dBμV or a mean squared error (MSE) in volts squared. Noise may also be characterized by its probability distribution and noise spectral density in watts per hertz. A noise signal is typically considered as a linear addition to a useful information signal. Noise power can be measured in watts or decibels (dB) relative to a standard power.

SUMMARY

Embodiments of the present disclosure may include a touch controller. The touch controller may include a measurement circuit, configured to receive a signal from an active channel in a proximity sensor, and to sample and hold the signal to measure the signal. The touch controller may include a driven shield buffer. The touch controller may include a voltage reference circuit configured to generate a divided voltage reference, provide the divided voltage reference to the measurement circuit, and drive the divided voltage reference through a switched circuit to the driven shield buffer to hold channels in the proximity sensor during measurement of the active channel. In combination with any of the above embodiments, the switched circuit may include a first switch, a second switch, a first capacitor, and a second capacitor. In combination with any of the above embodiments, the switched circuit may be configured to, in a first phase of operation, activate the first switch and the second switch to charge the second capacitor according to the divided voltage reference. In combination with any of the above embodiments, the switched circuit may be configured to, in a second phase of operation, alternatively activate the first switch and the second switch to drive the divided voltage reference through the first capacitor and the second capacitor to generate a channel voltage reference to hold the channels in the proximity sensor. In combination with any of the above embodiments, the switched circuit is configured to, in the second phase of operation and during each successive cycle, drive an equivalent amount of total charge from the first capacitor and the second capacitor to the held channels. In combination with any of the above embodiments, driving the divided voltage reference through the switched circuit may be configured to reduce noise originating from a voltage supply powering the divided voltage reference. In combination with any of the above embodiments, the divided voltage reference may be a mid-analog supply voltage.

Embodiments of the present disclosure may include a voltage reference circuit. The voltage reference circuit may include a power supply input connected to a resistive network, a first switch, a second switch connected to the first switch and to a midpoint of the resistive network, a first capacitor connected to a point between the first switch and the second switch, a second capacitor connected to the first capacitor and to the first switch, and a switch control signal configured to drive a divided voltage reference from the midpoint of the resistive network through the first switch, second switch, first capacitor, and second capacitor to hold channels of a proximity sensor during measurement of an active channel of the proximity sensor. In combination with any of the above embodiments, the voltage reference circuit may further include an output for the divided voltage reference to a measurement circuit. In combination with any of the above embodiments, the switch control signal may be configured to, in a first phase of operation, activate the first switch and the second switch to charge the second capacitor according to the divided voltage reference. In combination with any of the above embodiments, the switch control signal may be configured to, in a second phase of operation, alternatively activate the first switch and the second switch to drive the divided voltage reference through the first capacitor and the second capacitor to generate a channel voltage reference to hold the channels in the proximity sensor. In combination with any of the above embodiments, the switch control signal may be configured to, in a second phase of operation and during each successive cycle, drive an equivalent amount of total charge from the first capacitor and the second capacitor to the held channels. In combination with any of the above embodiments, driving the divided voltage reference through the switched circuit may be configured to reduce noise originating from a voltage supply powering the resistive network. In combination with any of the above embodiments, a midpoint of the resistive network may be a mid-analog supply voltage.

Embodiments of the present disclosure may include methods performed by any of the voltage reference circuits or touch controllers from above.

DETAILED DESCRIPTION

Figure 1:
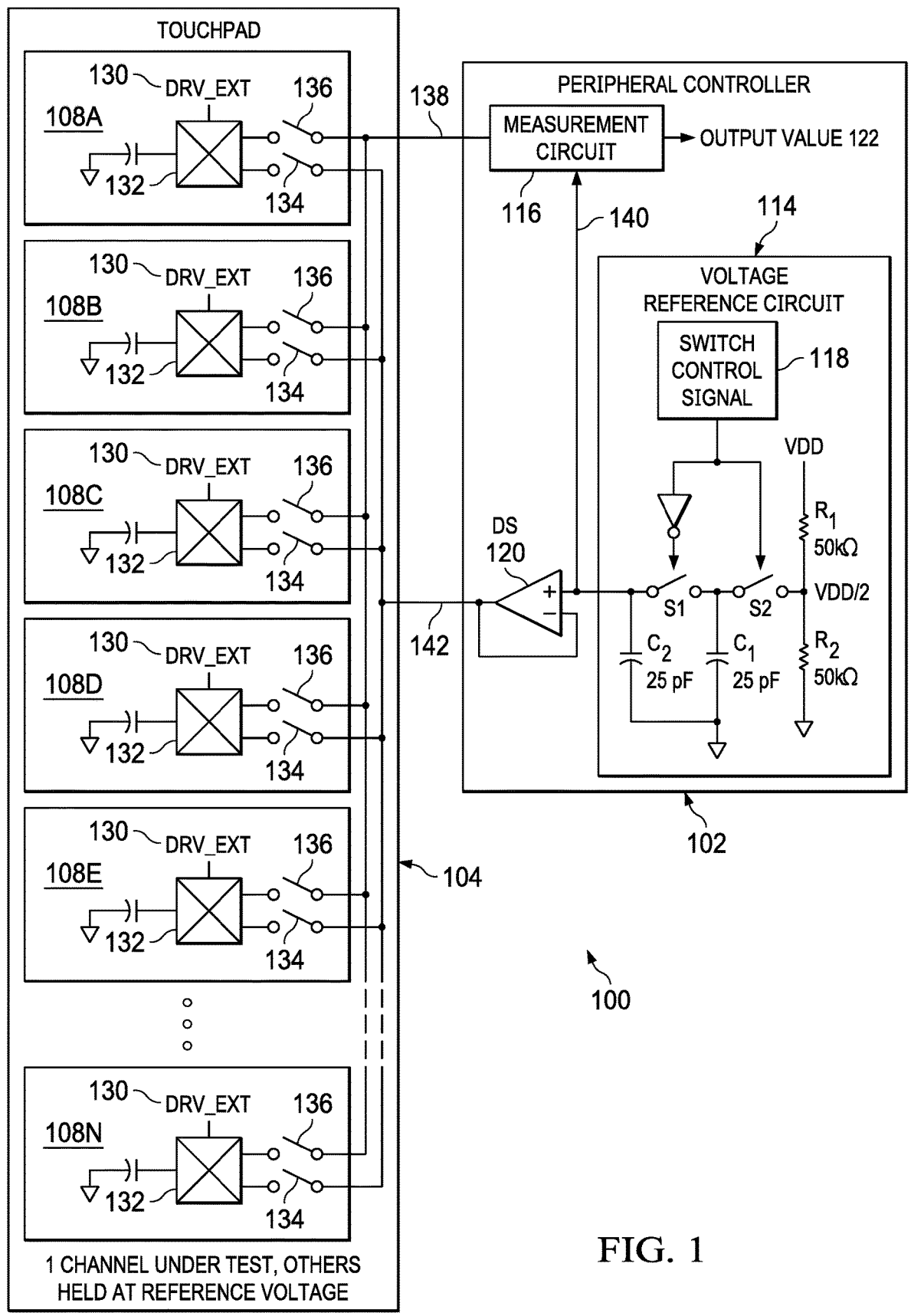
FIG. 1 is an illustration of a system for reference noise rejection, according to embodiments of the present disclosure.

FIG. 1 is an illustration of a system 100 for reference noise rejection, according to embodiments of the present disclosure. In one embodiment, system 100 may implement reference noise rejection using sample and hold circuitry.

In one embodiment, system 100 may include a reference voltage circuit 114. In another embodiment, system 100 may include a driven shield buffer 120 coupled or communicatively coupled to reference voltage circuit 114. Example implementations of reference voltage circuit 114 and driven shield buffer 120 are shown in FIG. 1, but in various embodiments, reference voltage circuit 114 and driven shield buffer 120 may include more or fewer components, or components arranged in a different but functionally equivalent manner, according to the configurations discussed in the present disclosure. Reference voltage circuit 114 may be configured to provide a reference voltage to other parts of system 100, alone or as modified by driven shield buffer 120. Such a reference voltage may be made wherein noise has been rejected or cancelled.

System 100 may include elements that may use reference voltages provided by reference voltage circuit 114, alone or as modified by driven shield buffer 120. For example, system 100 may include a peripheral controller 102. Peripheral controller 102 may be configured to control, interface with, or communicate with a peripheral. Such a peripheral may include, for example, a touchpad 104. Touchpad 104 may be configured to perform touch or proximity sensing as part of a human-machine interface for an electronic device. Touchpad 104 and peripheral controller 102 may be communicatively coupled through, for example, a switch matrix 112. Peripheral controller 102, touchpad 104, and switch matrix may be implemented using analog circuitry, digital circuitry, instructions for execution by a processor, or any suitable combination thereof. Peripheral controller 102 may be implemented on a chip, die, board, system-on-a-chip, or other suitable platform. In one embodiment, peripheral controller 102 may be implemented on the same platform as reference voltage circuit 114. In another embodiment, peripheral controller 102 may be implemented on a different platform as reference voltage circuit 114.

Figure 2:
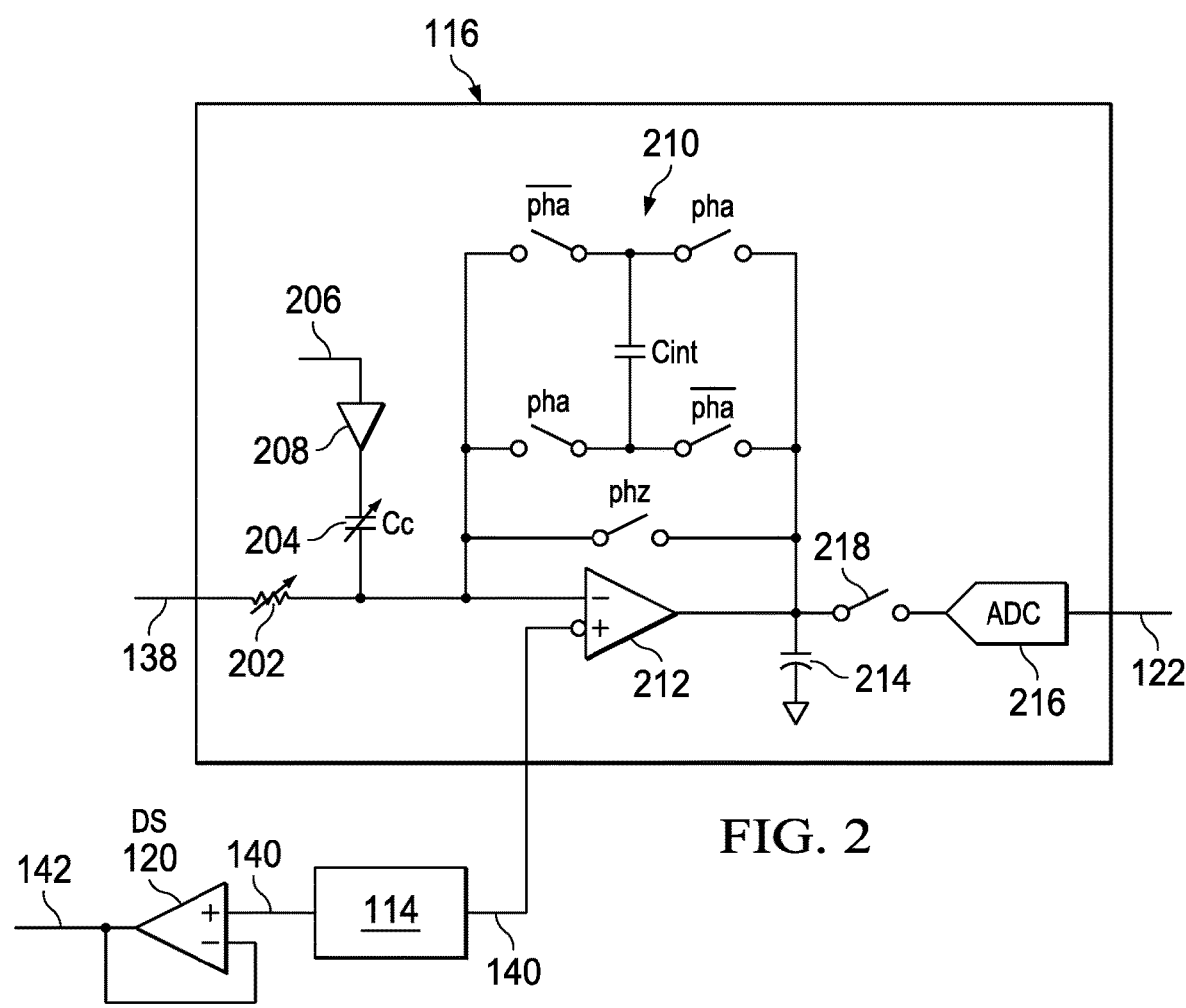
FIG. 2 is a more detailed view of elements of a system for reference noise rejection, according to embodiments of the present disclosure.

Peripheral controller 102 may be configured to take measurements from touchpad 104. Peripheral controller 102 may be further configured to perform processing on such measurements. Peripheral controller 102 may also be configured to, once a measurement is made, send the measured values to other entities, such as a larger system or processor, through output value 122. In order to perform measurements, peripheral controller 102 may include a measurement circuit 116. Measurement circuit 116 may be implemented using sample-and-hold circuits or topologies. Example implementations of measurement circuit 116 are shown in FIG. 2, below.

Touchpad 104 may be configured to generate signals according to proximity or touch of a foreign object, such as a finger or stylus, to a sensing surface. Touchpad 104 may include multiple channels 108, wherein each such channel may make independent measurements. Touchpad 104 may include any suitable number, N, of touchpad channels 108 arranged in any suitable configuration, such as linearly or a grid. The specific measurements from these different channels, when considered in view of the position of the channels, form data points about which a more complete view of proximity, position, or touch may be made by a recipient of output value 122.

Each channel 108 may include a touch sensor 132. Touch sensor 132 may be connected to ground through a capacitor and to a drive signal, such as drv_ext 130. Drv_ext 130 may be driven by an algorithm appropriate to allow capacitive detection. Such algorithms may be selected according to whether the sensor will be driven high, low, or undriven during the sequence. A tri-state driver may be used. Each channel 108 may include one or more switches, switch fabrics, multiplexers, or other suitable implementations to selectively route signals from peripheral controller 102. For example, voltage output 142 may be selectively routed from peripheral controller 102 to individual ones of channels 108. The selective routing may be performed by, for example, switch 134. In another example, a resultant measured voltage 138 from channel 108 may be selectively routed from an individual channel 108 to peripheral controller 102. The selective routing may be performed by, for example, switch 136. Switches 134, 136 may be implemented separately in individual channels 108 or together within a multiplexer, switch fabric, or other entity for all of channels 108.

To take a measurement from a given channel 108 to generate resultant measured voltage 138, the instance of switch 136 may cause a signal from the corresponding instance of sensor 132 to be routed to peripheral controller 102 as resultant measured voltage 138. The signal from sensor 132 may be driven by proximity or touch of a body to sensor 132 and driven by drv_ext 130. At the same time the measurement is taken from the given channel 108, in one embodiment, in the remaining channels 108, voltage output 142 may be applied. Voltage output 142 may be driven at reference voltage 140, ground, or supply to mimic integrator input line voltage used in measurement circuit 116. Voltage output 142 may thus mimic resultant measured voltage 138 at times. When a sensor is to be underdriven by a sensor driver at high impendence, voltage output 142 may mimic reference voltage. As a result, the capacitance between neighboring channels 108 may be nullified by driving them at the same voltage.

For example, during operation, a channel under test, such as channel 108A may generate a signal to measurement circuit 116. While such a measurement is being made, other channels of touchpad 104, such as channels 108B-108N, may be held at voltage output 142 from driven shield buffer 120. Driven shield buffer 120 may be configured to provide such a voltage output 142 after processing a reference voltage 140 from reference voltage circuit 114.

In one embodiment, reference voltage circuit 114 may be configured to provide a measurement reference voltage 140 to measurement circuit 116. In another embodiment, reference voltage circuit 114 may be configured to provide a channel reference voltage to driven shield buffer 120, which may in turn provide voltage output 142 to channels of touchpad 104.

Reference voltage circuit 114 may include a voltage divider circuit. A supply voltage, VDD, may be used as a source for reference voltage 140. VDD may be routed through two resistors, R1 and R2, before being passed to ground. The resistors may be of the same value, such as 50 Kohms. A reference voltage, such as the measurement reference voltage, may be obtained by tapping the voltage divider circuit between R1 and R2. The measurement reference voltage may be passed to measurement circuit 116 and expressed as VDD/2. In one embodiment, the measurement reference voltage may be passed through other components of reference voltage circuit 114 before being used for touchpad 104. The measurement reference voltage may be used, for example, an integrator part of measurement circuit 116 that operates using a voltage reference set according to the values of R1 and R2. When R1 and R2 are equal, the voltage reference may be set at mid-analog supply voltage. In other solutions, this reference might be generated from a simple resistive divider, and the reference also provided to touchpad 104. In such other solutions, this may result in a 3 dB rejection from supply noise. However, use of reference voltage circuit 114, provided through driven shield buffer 120, may allow instead a generation of the same measurement voltage reference as well as dividing the low frequency supply noise. This may operate under an assumption that the supply noise is uncorrelated with noise in ground.

Driver shield buffer 120 may be connected in follower mode, achieved by tying output on negative input. The output of driven shield buffer 120 may be output voltage 142. Output voltage may be tied to the inverting input of driven shield buffer 120, along with its other input, given as VREF. Output voltage 142 may be provided to touchpad 104 through switches, multiplexers, or other suitable mechanisms which may route the signal to the necessary channels. Reference voltage 140 may be generated from the original measurement reference voltage (VDD/2) as held and filtered through a circuit of switches S1, S2 and capacitors C1, C2. Switches S1 and S2 may provide a series connection between the original measurement reference voltage (VDD/2) and positive input of driven shield buffer 120. Capacitors C1 and C2 may be connected in series with respect to each other on a branch between a point between switches S1, S2 and a point between switch S1 and the positive input of driven shield buffer 120. Switches S1, S2 may be configured to be controlled by a switch control signal 118.

In one embodiment, during an initial phase of operation, switches S1 and S2 may be both activated so as to precharge the tank capacitance, C2, to a level closely approaching an expected value. An expected value may be VDD/2 without noise. Instead, what is available is (VDD+noise)/2. Accordingly, the difference may be (noise/2) that is eliminated with the sample-and-hold circuitry of voltage reference circuit 114. However, this correction may be slow, and thus precharging may allow voltage reference circuit 114 to start subsequent operation closer to the final value. After completion of the initial phase of operation, in a subsequent phase of operation, S1 and S2 may be driven by switch control signal 118 with complementary or polar opposite signals. This may result in only one of S1 and S2 to be activated at a time. The frequency of such signals may be set according to design characteristics of the components of system 100. In each cycle during the second phase of operation, the quantity of charges transferred from supply to reference (and stored in tank capacitance C2) is proportional to C1/C2. This may result in an attenuation of noise from the supply (VDD) of the factor C1(C1+C2). This factor, C1(C1+C2), is approximately C1/C2 if C2 is much greater than C1. Use of reference voltage circuit 114 and driven shield buffer 120 may allow the disuse or exclusion of a linear voltage regulator to perform the same task.

In a given cycle of the second phase of switch control signal, S1 and S2 may be alternatively enabled and disabled with respect to each other. When S1 is open, S2 may be closed. When S2 is open, S1 may be closed.

During a cycle i of the second phase of switch control signal 118, when the signals to S1 and S2 are alternating, and S1 is switched off and S2 is switched on, the charge of C2 and C1 may be given as:

$$Q_{2(i)} = Vref_{i-1} \cdot C_2$$

$$Q_{1(i)} = \left(\frac{VDD}{2} + \frac{V_{Ni}}{2}\right) \cdot C_1$$

Furthermore, during the next cycle i+1 within the same, second phase of switch control signal 118, when the signals to S1 and S2 are alternating, and S1 is switched on and S2 is switched off, the charge accumulated on C2 and C1 may be given as:

$$Q_{2(i+1)} = Vref_i \cdot C_2$$

$$Q_{1(i+1)} = Vref_i \cdot C_1$$

N may identify noise, and $V_N$ may be the noise contribution to the voltage. Comparing between the first and second cycles, i and i+1, the global charge of C1 and C2 may remain unchanged:

$$Q_{1(i)} + Q_{2(i)} = Q_{1(i+1)} + Q_{2(i+1)}$$

$$Vref_i = Vref_{i-1} + \frac{V_{DD}}{2} \cdot \frac{C_1}{C_2} + \frac{V_{Ni}}{2} \cdot \frac{C_1}{C_2} - Vref_i \cdot \frac{C_1}{C_2}$$

After a large number of iterations and i becomes large:

$$\sum \frac{V_{Ni}}{2} \Rightarrow 0$$

$$\sum Vref_{i-1} + \frac{C_1}{C_2} \cdot \left(\frac{V_{DD}}{2} - Vref_i\right) \Rightarrow \frac{V_{DD}}{2}$$

The maximum noise within one cycle is given by $$\frac{V_{Ni}}{2} \cdot \frac{C_1}{C_2}$$

This may represent a 40-dB improvement in noise from the supply voltage as provided to the channels of touchpad 104.

FIG. 2 is a more detailed illustration of system 100, according to embodiments of the present disclosure. FIG. 2 illustrates example implementations of measurement circuit 116

In order to make measurements from touchpad 104, measurement circuit 116 may include a driver signal 206 to enable sampling and an analog input 138 from touchpad 104. Reference voltage 140 may be issued from reference voltage circuit 114 to a positive input of an op-amp 212, while the input 138 from touchpad 104 may be routed through a resistor 202 to the negative input of op-amp 212. Driver signal 206 may be sent through a buffer 208 and a variable capacitor 204 and connected to the negative input of op-amp 212. A feedback circuit 210 may be implemented between the output of op-amp 212 and the negative input of op-amp 212. Feedback circuit may include a series of switches and capacitors such that output of op-amp 212 is held while a sample of the output of op-amp 212 may be taken. A capacitor 214 may be connected between output of op-amp 212 and ground. The sample may be made using a switch 218 attached to an analog-to-digital converter (ADC) 216 circuit. Output of ADC 216 may include output value 122.

An integrator may be formed by op-amp 212 and capacitor Cint. Switches within feedback circuit 210 (controlled by pha and not pha) may allow swapping polarity of capacitor Cint.

Returning to FIG. 1, without system 100, voltage reference 140 might otherwise simply be VDD/2, if created from a resistive divider result in only a 3-dB rejection. However, in such a case, the reference voltage is itself noisy. Instead, voltage reference circuit 114 may cause voltage reference 140 to be less noisy, even without a linear regulator. Other solutions might use a linear regulator in place of all or part of voltage reference circuit 114. A linear regulator is used for supplying the whole controller, having an intrinsic rejection that handle the supply noise. Without such a linear regulator, the controller is susceptible to power supply noise. This would occur particularly when a direct DC/DC regulator supplies controller. In yet other solutions, channels of touchpad 104 being held to a reference voltage or ground may be connected to or driven by ground of a die, printed circuit board, or appliance of a system. In such solutions, performance may be severely limited.

A bandgap might not be used a reference as it is not compatible with existing algorithms. A modified algorithm to use bandgap as a reference is complex and bigger in size. During a given measurement of touchpad 104, panel-traces are driven from VDD, VDD/2 and GND. Bandgap voltage might not include one of these. Having VDD/2 as a reference simplifies the algorithm.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. A touch controller comprising:
   a measurement circuit, configured to:
      receive a signal from an active channel in a proximity sensor; and
      sample and hold the signal to measure the signal;
   a driven shield buffer; and
   a voltage reference circuit, configured to:
      generate a divided voltage reference;
      provide the divided voltage reference to the measurement circuit; and
      drive the divided voltage reference through a switched circuit to the driven shield buffer to hold channels in the proximity sensor during measurement of the active channel, wherein:
         the switched circuit includes a first switch, a second switch, a first capacitor, and a second capacitor; and
         the switched circuit is configured to, in a second phase of operation:
            alternatively activate the first switch and the second switch to drive the divided voltage reference through the first capacitor and the second capacitor to generate a channel voltage reference to hold the channels in the proximity sensor; and
            during each successive cycle, drive an equivalent amount of total charge from the first capacitor and the second capacitor to the held channels.

2. The touch controller of claim 1, wherein the switched circuit is configured to, in a first phase of operation, activate the first switch and the second switch to charge the second capacitor according to the divided voltage reference.

3. The touch controller of claim 1, wherein the switched circuit is configured to, in a second phase of operation, alternatively activate the first switch and the second switch to drive the divided voltage reference through the first capacitor and the second capacitor to generate a channel voltage reference to hold the channels in the proximity sensor.

4. The touch controller of claim 1, wherein driving the divided voltage reference through the switched circuit is configured to reduce noise originating from a voltage supply powering the divided voltage reference.

5. The touch controller of claim 1, wherein the divided voltage reference is a mid-analog supply voltage.

6. A voltage reference circuit, comprising:
   a power supply input connected to a resistive network;
   a first switch;
   a second switch connected to the first switch and to a midpoint of the resistive network;
   a first capacitor connected to a point between the first switch and the second switch;
   a second capacitor connected to the first capacitor and to the first switch; and
   a switch control signal configured to drive a divided voltage reference from the midpoint of the resistive network through the first switch, second switch, first capacitor, and second capacitor to hold channels of a proximity sensor during measurement of an active channel of the proximity sensor;
   wherein the switch control signal is configured to, in a second phase of operation:
      alternatively activate the first switch and the second switch to drive the divided voltage reference through the first capacitor and the second capacitor to generate a channel voltage reference to hold the channels in the proximity sensor; and
      during each successive cycle, drive an equivalent amount of total charge from the first capacitor and the second capacitor to the held channels.

7. The voltage reference circuit of claim 6, further comprising an output for the divided voltage reference to a measurement circuit.

8. The voltage reference circuit of claim 6, wherein the switch control signal is configured to, in a first phase of operation, activate the first switch and the second switch to charge the second capacitor according to the divided voltage reference.

9. The voltage reference circuit of claim 6, wherein the switch control signal is configured to, in a second phase of operation, alternatively activate the first switch and the second switch to drive the divided voltage reference through the first capacitor and the second capacitor to generate a channel voltage reference to hold the channels in the proximity sensor.

10. The voltage reference circuit of claim 6, wherein driving the divided voltage reference through the switched circuit is configured to reduce noise originating from a voltage supply powering the resistive network.

11. The voltage reference circuit of claim 6, wherein the midpoint of the resistive network is a mid-analog supply voltage.

12. A method, comprising:
   receiving a signal from an active channel in a proximity sensor;

sampling and holding the signal to measure the signal;
generating a divided voltage reference;
providing the divided voltage reference to a measurement circuit configured to perform the steps of sampling and holding the signal to measure the signal;
driving the divided voltage reference through a switched circuit to a driven shield buffer to hold channels in the proximity sensor during measurement of the active channel;
in a second phase of operation of the switched circuit, alternatively activating the first switch and the second switch to drive the divided voltage reference through a first capacitor and the second capacitor to generate a channel voltage reference to hold the channels in the proximity sensor; and
in the second phase of operation of the switched circuit, during each successive cycle, driving an equivalent amount of total charge from the first capacitor and the second capacitor to the held channels.

13. The method of claim 12, further comprising, in a first phase of operation of the switched circuit, activating a first switch and the second switch to charge a second capacitor according to the divided voltage reference.

14. The method of claim 12, wherein driving the divided voltage reference through the switched circuit reduces noise originating from a voltage supply powering the divided voltage reference.

* * * * *